United States Patent [19]

Malwah

[11] 4,398,964
[45] Aug. 16, 1983

[54] METHOD OF FORMING ION IMPLANTS SELF-ALIGNED WITH A CUT

[75] Inventor: Manohar L. Malwah, Sunnyvale, Calif.

[73] Assignee: Signetics Corporation, Sunnyvale, Calif.

[21] Appl. No.: 329,364

[22] Filed: Dec. 10, 1981

[51] Int. Cl.³ ............... H01L 21/265; H01L 21/26; B05D 3/06
[52] U.S. Cl. ..................... 148/1.5; 29/571; 29/576 B; 148/187; 156/643; 156/661.1; 427/43.1
[58] Field of Search ............. 148/1.5, 187; 29/571, 29/576 B; 156/661.1, 643; 427/43.1

[56] References Cited

U.S. PATENT DOCUMENTS

| | | | |
|---|---|---|---|
| 4,004,044 | 1/1977 | Franco et al. | 427/43.1 |
| 4,022,932 | 5/1977 | Feng | 427/93 |
| 4,040,891 | 8/1977 | Chang et al. | 156/661.1 |
| 4,144,101 | 3/1979 | Rideout | 156/643 |
| 4,201,800 | 5/1980 | Alcorn et al. | 156/661.1 |
| 4,231,811 | 11/1980 | Somekh | 148/1.5 |
| 4,253,888 | 3/1981 | Kikuchi | 148/187 |
| 4,311,533 | 1/1982 | Roche | 148/1.5 |
| 4,341,571 | 7/1982 | Hiss et al. | 148/1.5 |
| 4,350,541 | 9/1982 | Mizushima et al. | 148/187 |

FOREIGN PATENT DOCUMENTS

| | | |
|---|---|---|
| 53-76757 | 7/1978 | Japan . |
| 53-89673 | 7/1978 | Japan . |
| 55-55531 | 4/1980 | Japan . |
| 55-55532 | 4/1980 | Japan . |
| 55-95324 | 7/1980 | Japan . |

OTHER PUBLICATIONS

IBM Technical Disclosure Bulletin, vol. 21, No. 5, Oct. 1978, pp. 1900-1901.

Primary Examiner—Upendra Roy
Attorney, Agent, or Firm—Jerry A. Dinardo; Robert T. Mayer; Jack Oisher

[57] ABSTRACT

A method of fabricating a thick field oxide isolation layer employs dual photoresist layers and selective ion implantation. A thick field oxide layer is grown on a silicon wafer and is covered with a negative photoresist layer followed by a thicker positive photoresist layer. The positive photoresist layer is exposed through a mask and developed to leave a portion remaining where an aperture in the field oxide is to be made. Boron ions are implanted into the silicon wafer through the layers not covered by positive photoresist. The remaining positive photoresist and the underlying negative photoresist are removed to expose the field oxide, after which the patterned negative photoresist is used as a mask to etch a hole in the field oxide that is self-aligned between the boron implants.

11 Claims, 5 Drawing Figures

METHOD OF FORMING ION IMPLANTS SELF-ALIGNED WITH A CUT

BACKGROUND OF THE INVENTION

This invention relates to integrated circuit processing involving ion implantation, and more particularly to a method of producing ion implants in regions of a semiconductor body whose edges are self-aligned with a cut or opening in a stratum of material that lies above the implanted regions.

In fabricating semiconductor integrated circuits, it is sometimes required to produce ion deposits in spaced regions of the semiconductor body so that the space between the ion deposits is in alignment with an opening in a layer of insulating material lying above the ion deposits. In metal-oxide-semiconductor (MOS) circuits, for example, a thick field oxide layer is formed on the surface of the semiconductor body. In the finished device the field oxide serves as an insulating support for conductive members as well as a means for electrically isolating one active transistor region from the other that lie in voids formed in the thick field oxide layer. During device processing the field oxide layer serves as a mask for selective chemical etching as well as selective impurity doping. Beneath the field oxide in the semiconductor body lie ion deposits or channel stops of sufficient ion concentration to prevent undesired transistor action anywhere outside the active transistor regions.

A typical procedure followed in MOS processing is to introduce the ion deposits for the channel stops into the semiconductor body before the field oxide is thermally grown on the surface of the semiconductor body. There are several drawbacks that result from this procedure. For one thing, there is a tendency for some of the ion deposits to diffuse into the active transistor regions as a result of thermal activation, thereby narrowing the active regions.

Another effect that contributes to narrowing the active regions is the so-called "bird-beak effect" in the selective oxidation process. When the field oxide is thermally grown, it grows both above the surface as well as into the body of the semiconductor wafer and beneath the oxidation masking material, such as silicon nitride. As it grows beneath the oxidation mask, both laterally and depthwise, the field oxide lifts the oxidation mask, so that when viewed in cross section, the shape of the field oxide layer resembles the beak of a bird, being thick at the unmasked regions and tapering to a point somewhat inwardly beneath the oxidation mask. The "bird-beak effect" also contributes to narrowing the active regions because it extends the field oxide layer into a part of the masked region, thus cutting down the width of the field-oxide-free region the oxidation mask was designed to produce.

Besides narrowing the width of the transistor active regions, the "bird-beak effect" also narrows the width of strip conductors that will be formed by heavy dosage of dopant, implanted or diffused in regions of the wafers that are devoid of field oxide, thereby reducing the conductance of the strip conductors.

According to another technique for forming the active regions in the semiconductor surface, a hole is etched through the field oxide layer and the bare silicon surface is etched in the active region to remove ion deposits that were previously introduced to form the channel stop regions. The silicon etch produces undercutting of the silicon beneath the field oxide. The undercutting is detrimental in that the surface irregularities introduce light reflection problems during later photolithographic processing steps. The increased step height from the active region to the top of the thick field oxide that results from the silicon etch also aggravates the step coverage problem for metallic interconnects in and out of the active regions.

There is a great need to eliminate or at least minimize the undesirable effects that result from prior art processing.

SUMMARY OF THE INVENTION

According to the invention a method is set forth which utilizes a combination of two different photoresist materials for producing an aperture in a stratum of material covering the surface of a semiconductor body and for producing ion implants in a stratum of the semiconductor body in regions thereof underlying the first-mentioned stratum of material and offset from and self-aligned with the aperture.

A series of processing steps includes providing a semiconductor body having a first stratum therein and providing a second stratum of material adjacent to the first stratum. Successive layers of a thin negative photoresist and a thicker positive photoresist are superimposed over the second stratum of material in that order. Spaced portions of the positive photoresist layer are selectively and photolithographically removed to produce voids therein. The structure thus produced is subjected to impurity ions of such velocity that impurity ions deposit in laterally spaced implanted regions of the first stratum that are aligned directly with the voids in the positive photoresist layer but are blocked from regions underlying the positive photoresist layer. The remaining positive photoresist layer and the underlying part of the negative photoresist layer are removed. While using the remaining negative photoresist layer as a mask, the exposed portion of the material of the second stratum is removed to produce an aperture within the second stratum that is self aligned with and offset from the laterally spaced regions of implanted impurity ions.

While there is prior art that teaches the use of dual photoresist layers to produce a fine hole pattern there is none among these that teach how to produce implants offset from and self-aligned with the hole pattern. The following prior art references disclose dual photoresist layer processing to produce fine hole patterns.

| | |
|---|---|
| Japanese Kokai | 53-76757 |
| Japanese Kokai | 53-89673 |
| Japanese Kokai | 55-55531 |
| Japanese Kokai | 55-55532 |
| IBM Technical Disclosure Bulletin, Vol. 21, No. 5, October 1978, p 1900–1901 | |

DESCRIPTION OF THE PREFERRED EMBODIMENT

Figure 1:
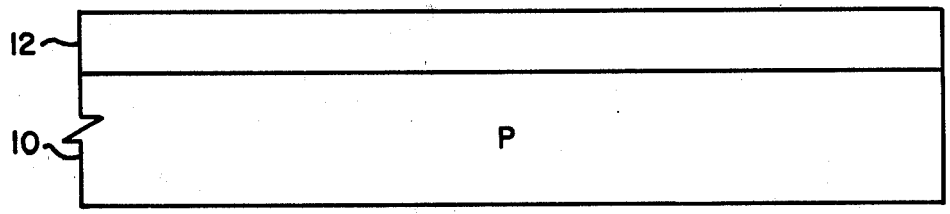
FIGS. 1–5 are cross-sectional views of a portion of a semiconductor wafer showing various stages of the method according to the invention.

Reference is now made to FIG. 1, wherein a semiconductor body or wafer 10 is provided on a surface thereof with a layer 12 of insulating material. The semiconductor body 10 may comprise a wafer of monocrystalline silicon destined to contain an integrated circuit pattern of MOS devices. For this purpose it is desirable to start with a <100> oriented silicon wafer that is doped with suitable N or P impurities to produce desired MOS transistor characteristics.

Typically, where the insulating layer 12 is to serve as the field oxide isolation, it may be thermally grown in a wet ambient, such as by passing steam over the surface of the semiconductor body 10, while the latter is heated to about 1000° C., until the layer 12 reaches a thickness of about 4500–6000 angstroms. Alternatively, the insulating layer 12 may comprise silicon nitride of suitable thickness and may be deposited on the surface of the semiconductor body 10 by exposing it to a radio frequency plasma of silane and ammonia.

Figure 2:
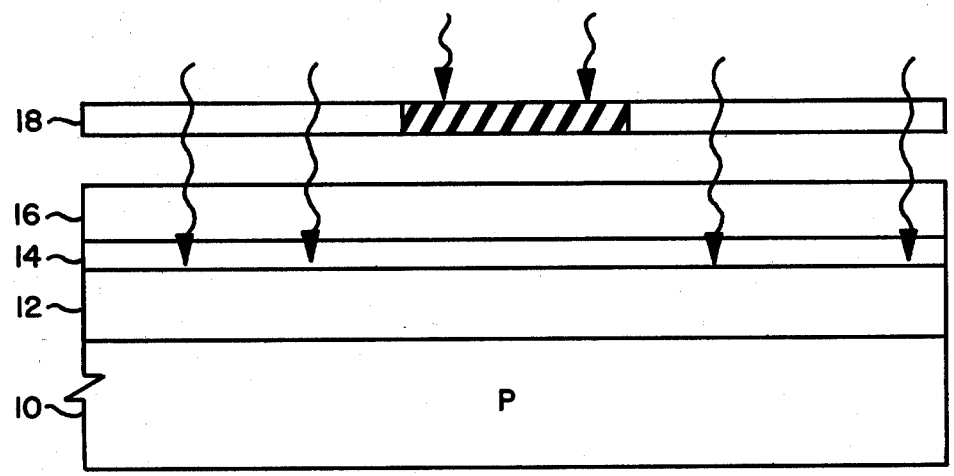

The next series of processing steps are shown in FIG. 2 and include the application of a negative photoresist layer or coating 14 followed by a positive resist layer or coating 16. The negative photoresist coating 14 may be spun on in conventional fashion and soft baked at 95° C. The thickness of the negative photoresist coating 14 is about 3000 angstroms and may comprise what is known in the trade as KTI 45.

The positive photoresist coating 16 may likewise be spun on and soft baked at 95° C. Its thickness however is much greater than the negative photoresist coating 14 and is about 15,000 angstroms. A suitable positive photoresist material is HPR 204 manufactured by Hunt Chemical Co.

The photoresist coatings 14 and 16 are then pattern exposed through a mask 18 which allows the ultraviolet light to penetrate both photoresist coatings 14 and 16 through the transparent areas of the mask 18 and blocks the light in the opaque area. The transparent areas of the mask 18 are shown clear in FIG. 2 and the opaque area is shown cross-hatched. When the wafer is developed with positive photoresist developer, the exposed areas of the positive photoresist coating 14 are dissolved because they were rendered more soluble by the light exposure, but the exposed areas of the negative photoresist coating 16 remain intact because they were polymerized by the light exposure and rendered less soluble.

Figure 3:
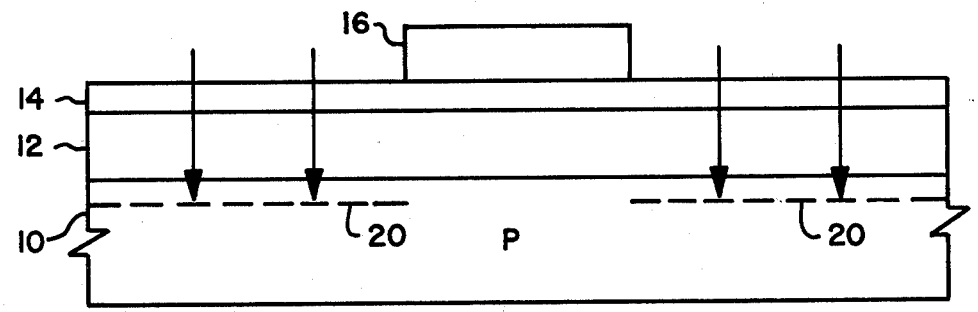

The next step is shown in FIG. 3, wherein the wafer is subjected to a boron ion implantation step. The boron ion energy is adjusted to allow the ions to penetrate through the negative photoresist coating 14 and the insulating layer 12, such as the field oxide, and to form negative ion deposits or channel stops 20 extending a slight depth beneath the surface of the semiconductor body 10. The ion energy is not sufficient to allow the ions to penetrate the thick positive photoresist coating 16. The boron ion dosage is adjusted to obtain the desired high threshold voltage for the field transistor that is ultimately provided by the combination with the channel stops 20 and the field oxide 12 of a conductive gate-forming layer that is provided over the field oxide 12 during subsequent processing steps. The boron concentration for the channel stops 20 must be high enough to raise the threshold voltage of the channel stop or field transistor to a level sufficient to prevent conduction thereof at the normal voltage levels of the active transistors.

Figure 4:
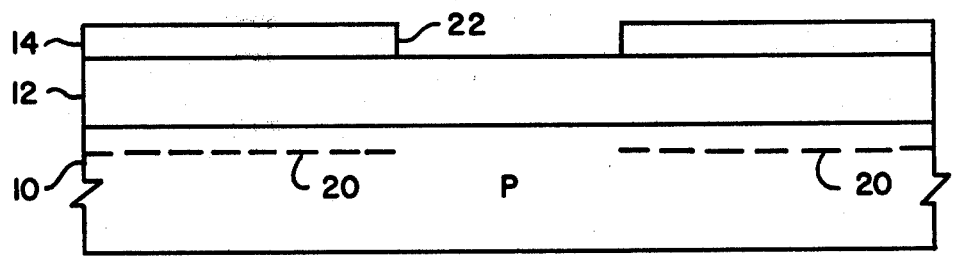

Following the ion implantation step, the unexposed positive photoresist coating 16 is stripped by exposing it to a high concentration of developer for an extended time of approximately 10 minutes. With the positive photoresist coating 16 removed, the portion of the negative photoresist coating 14 that was protected from exposure by the undeveloped positive photoresist coating 16 is now developed and removed, leaving the structure shown in FIG. 4. In FIG. 4, the developed negative photoresist coating 14 is shown patterned with an aperture 22 between and self-aligned with the edges of the channel stops 20 and exposing a part of the thick insulating layer 12.

The remaining negative photoresist coating 14 can now be used as a mask to selectively etch away an aperture in the thick insulating layer 12. In the case of a field oxide insulating layer 12, the etchant can be diluted hydrofluoric acid (HF), and in the case of a silicon nitride insulating layer 12, plasma etching of silicon nitride in $CF_4$ gas can be used. After the insulating layer 12 is pattern etched, the negative photoresist coating 14 is stripped away by exposing it to a high concentration of developer for an extended time, leaving the structure remaining as shown in FIG. 5.

Figure 5:
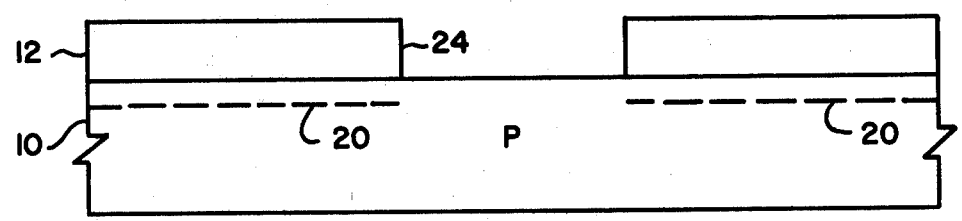

In the final structure shown in FIG. 5, the aperture 24 in the thick insulating layer 12 and the laterally spaced channel stops 20 have their edges self-aligned, with the channel stops 20 being offset from the aperture 24. Because the ion implantation step for the channel stops 20 occurred after the formation of the insulating layer 12, the "bird-beak effect" that results from selective oxidation processing is not present. Thus, where the aperture 24 in the thick insulating layer 12 defines the active transistor region, there is no width effect or cutting down on the size of the active transistor region. Although not illustrated, it is apparent that a transistor of the MOS kind can be fabricated in and on the semiconductor body 10 within the confines of the aperture 24 and between the channel stops 20.

It is also apparent that instead of containing a transistor, the active semiconductor region lying between the channel stops 20 and within the confines of the aperture 24 may be used to form an N+ diffused or implanted region for an elongated semiconductor interconnect or an N+ contact region to which a metallic interconnect is made.

By omitting the silicon etch to form the active regions, severe surface irregularities are avoided at the interface between the silicon body 10 and the insulating layer 12. Light reflection problems will be alleviated during later processing, as will be the problem of making good metallic interconnect within the aperture 24. In the case of forming an elongated N+ semiconductor interconnect within the semiconductor region beneath the aperture 24, there is no "bird-beak effect" present to reduce the permissible width of the interconnect and increase its resistance.

What is claimed is:

1. A method of implanting impurity ions in regions lying laterally spaced apart within a first stratum of a semiconductor body and offset and self-aligned with the edges of an opening formed within a second stratum of material lying above said first stratum, said method comprising:
   (a) providing a semiconductor body having a first stratum therein and providing a second stratum of material adjacent to said first stratum,
   (b) superimposing successive layers of a thin negative photoresist and a thicker positive photoresist over said second stratum in that order,
   (c) removing only selected spaced portions of said positive photoresist layer by photolithographic means to produce voids therein, (d) subjecting the structure thus formed to impurity ions of such velocity that impurity ions deposit in laterally spaced implanted regions of said first stratum that are aligned with said voids but are blocked from regions underlying said positive photoresist layer, (e) removing the remaining positive photoresist layer and the underlying part of negative photoresist layer, and (f) while using the remaining negative photoresist layer as a mask, removing material of said second stratum that is uncovered by said negative photoresist layer to produce an opening within said second stratum that is self-aligned with and disposed between said laterally spaced regions of implanted impurity ions.

2. The invention according to claim 1, wherein said semiconductor body and said second stratum of material are made of different material.

3. The invention according to claim 1, wherein said semiconductor body is silicon and said second stratum of material comprises silicon dioxide that is thermally grown on said silicon.

4. The invention according to claim 1, wherein said second stratum of material comprises silicon nitride.

5. The invention according to claim 3 wherein said silicon dioxide layer is about 4000–6000 angstroms thick.

6. The invention according to claim 5 wherein said negative photoresist layer is about 3000 angstroms thick and said positive photoresist is about 15,000 angstroms thick.

7. The invention according to claim 1, wherein said semiconductor body comprises P type silicon and said impurity ions comprise boron.

8. The invention according to claim 1, wherein in step (e) said positive photoresist layer is removed by chemical stripping, after which said underlying part of the negative photoresist layer is removed with a developer solvent.

9. The invention according to claim 1, wherein in step (f) the material of said second stratum is removed by chemical means.

10. The invention according to claim 1, and further including the step of removing the remaining negative photoresist layer after said opening is produced.

11. The invention according to claim 10, wherein said remaining negative photoresist layer is removed by chemical stripping.

* * * * *